United States Patent
Wendt et al.

(10) Patent No.: US 11,127,602 B2
(45) Date of Patent: Sep. 21, 2021

(54) METHOD OF FASTENING A SEMICONDUCTOR CHIP ON A LEAD FRAME, AND ELECTRONIC COMPONENT

(71) Applicant: OSRAM Opto Semiconductors GmbH, Regensburg (DE)

(72) Inventors: Mathias Wendt, Hausen (DE); Klaus Müller, Pettendorf (DE); Laurent Tomasini, Reutte (AT)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/489,726

(22) PCT Filed: Feb. 28, 2018

(86) PCT No.: PCT/EP2018/054975
§ 371 (c)(1),
(2) Date: Aug. 29, 2019

(87) PCT Pub. No.: WO2018/158341
PCT Pub. Date: Sep. 7, 2018

(65) Prior Publication Data
US 2020/0234976 A1 Jul. 23, 2020

(30) Foreign Application Priority Data
Mar. 1, 2017 (DE) .......................... 102017104276.8

(51) Int. Cl.
*H01L 21/48* (2006.01)
*H01L 23/498* (2006.01)
(Continued)

(52) U.S. Cl.
CPC .... *H01L 21/4857* (2013.01); *H01L 23/49822* (2013.01); *H01L 23/49866* (2013.01)

(58) Field of Classification Search
CPC .................................................. H01L 21/4857
See application file for complete search history.

(56) References Cited

U.S. PATENT DOCUMENTS

| | | | |
|---|---|---|---|
| 5,234,153 | A | 8/1993 | Bacon et al. |
| 6,334,567 | B1 | 1/2002 | Xie et al. |

(Continued)

FOREIGN PATENT DOCUMENTS

| | | | |
|---|---|---|---|
| DE | 195 32 250 A1 | 3/1997 | |
| DE | 197 47 846 A1 | 5/1999 | |

(Continued)

OTHER PUBLICATIONS

Kuhmann, J. F., et al. "Oxidation and Reduction Kinetics of Eutectic SnPb, InSn, and AuSn: A Knowledge Base for Fluxless Solder Bonding Applications". *IEEE Transactions on Components, Packaging, and Manufacturing Technology Part C* 21(2): 134-140. Apr. 1, 1998.

*Primary Examiner* — Omar F Mojaddedi
(74) *Attorney, Agent, or Firm* — DLA Piper LLP (US)

(57) ABSTRACT

A method of attaching a semiconductor chip to a lead frame, including A) providing a semiconductor chip, B) applying a solder metal layer sequence on the semiconductor chip, C) providing a lead frame, D) applying a metallization layer sequence on the lead frame, E) applying the semiconductor chip on the lead frame via the solder metal layer sequence and the metallization layer sequence, and F) heating the arrangement produced under E) to attach the semiconductor chip to the lead frame, wherein the solder metal layer sequence includes a first metallic layer including an indium-tin alloy, a barrier layer arranged above the first metallic layer, and a second metallic layer including gold arranged between the barrier layer and the semiconductor chip.

10 Claims, 3 Drawing Sheets

(51) Int. Cl.
*H01L 33/00* (2010.01)
*H01S 5/0237* (2021.01)
*H01L 23/48* (2006.01)
*B23K 1/00* (2006.01)

(56) References Cited

U.S. PATENT DOCUMENTS

| | | | |
|---|---|---|---|
| 6,590,913 B1 | 7/2003 | Caras et al. | |
| 2003/0067950 A1 | 4/2003 | Hanaoka | |
| 2004/0201029 A1* | 10/2004 | Yamane | H01L 24/29 |
| | | | 257/99 |
| 2007/0001315 A1* | 1/2007 | Yokoyama | H01L 23/49866 |
| | | | 257/779 |
| 2008/0205013 A1* | 8/2008 | Oshika | H01L 24/83 |
| | | | 361/767 |
| 2013/0037603 A1* | 2/2013 | Choi | H01L 25/0657 |
| | | | 228/203 |
| 2014/0110848 A1* | 4/2014 | Taylor | H01L 24/83 |
| | | | 257/766 |
| 2014/0273318 A1* | 9/2014 | Ryu | H01L 24/29 |
| | | | 438/26 |
| 2014/0312476 A1* | 10/2014 | Wang | H01L 23/495 |
| | | | 257/666 |
| 2016/0027751 A1* | 1/2016 | Kim | H01L 24/13 |
| | | | 257/737 |

FOREIGN PATENT DOCUMENTS

| | | |
|---|---|---|
| EP | 1 482 544 A1 | 12/2004 |
| GB | 2 300 375 A | 11/1996 |
| JP | 2004-349595 A | 12/2004 |

\* cited by examiner

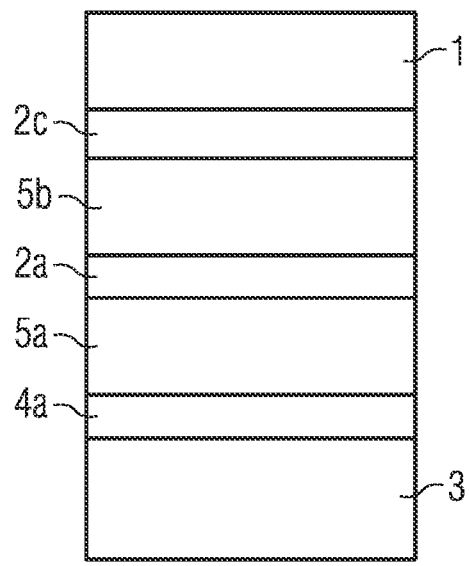
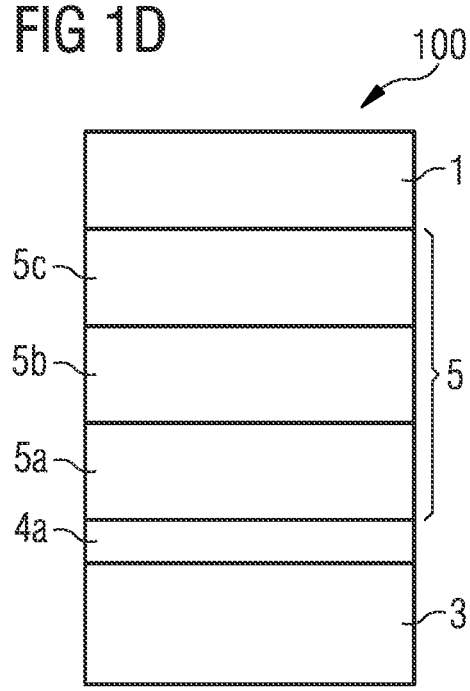

METHOD OF FASTENING A SEMICONDUCTOR CHIP ON A LEAD FRAME, AND ELECTRONIC COMPONENT

TECHNICAL FIELD

This disclosure relates to a method of attaching a semiconductor chip to a lead frame and an electronic component.

BACKGROUND

To connect a semiconductor chip to a lead frame, the semiconductor chips are often soldered to the lead frame during production of electronic components. Due to the difference in thermal expansion behavior between the semiconductor chip and the material of the lead frame, tensions arise in the composite of semiconductor chip and lead frame when cooling from the soldering temperature to room temperature. These can lead to the initiation of cracks, for example, in the carrier material of the semiconductor chip if the electronic component is subjected to mechanical stress. For example, a gold-tin solder is used to solder semiconductor chips to lead frames. With that solder the soldering temperature is in the range of 300° C. Due to the high soldering temperature and the different thermal expansion behavior, considerable thermally induced mechanical stresses occur during cooling of the composite of lead frame and semiconductor chip. If the component is subjected to further mechanical stress, this can lead to failure of the solder joint or initiation of cracks in the substrate or the solder joint.

It could therefore be helpful to provide a method of attaching a semiconductor chip to a lead frame that is improved compared to conventional methods and to an electronic component produced by the method.

SUMMARY

We provide a method of attaching a semiconductor chip to a lead frame, including A) providing a semiconductor chip, B) applying a solder metal layer sequence on the semiconductor chip, C) providing a lead frame, D) applying a metallization layer sequence on the lead frame, E) applying the semiconductor chip on the lead frame via the solder metal layer sequence and the metallization layer sequence, and F) heating the arrangement produced under E) to attach the semiconductor chip to the lead frame, wherein the solder metal layer sequence includes a first metallic layer including an indium-tin alloy, a barrier layer arranged above the first metallic layer, and a second metallic layer including gold arranged between the barrier layer and the semiconductor chip.

We also provide an electronic component including a lead frame and a semiconductor chip arranged above the lead frame, wherein a connection layer sequence is arranged between the lead frame and the semiconductor chip, and the connection layer sequence includes a first intermetallic layer including indium, tin and nickel, a second intermetallic layer including indium, tin and a titanium compound, indium, tin and nickel, indium, tin and platinum or indium, tin and titanium and a third intermetallic layer including indium, tin and gold, the first intermetallic layer is arranged above the lead frame, the second intermetallic layer is arranged above the first intermetallic layer, and the third intermetallic layer is arranged between the second intermetallic layer and the semiconductor chip, and the third intermetallic layer is arranged in direct contact on the semiconductor chip.

BRIEF DESCRIPTION OF THE DRAWINGS

FIGS. 1A to 1D schematically show a method of producing an electronic component.

Figure 1A:
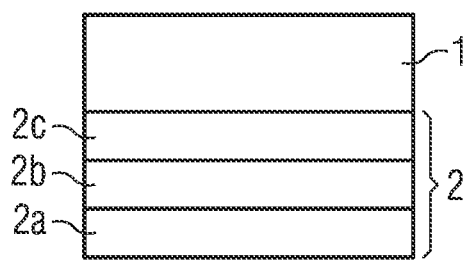
Figure 1A:
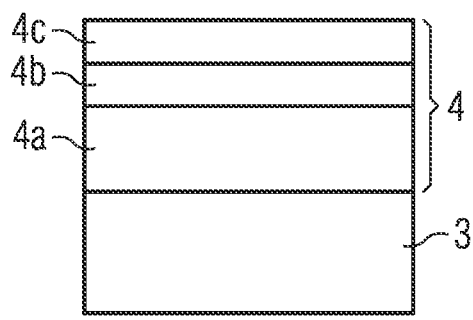

REFERENCE SIGNS 1 semiconductor chip
2 solder metal layer sequence
3 lead frame
4 metallization layer sequence
5 connection layer sequence
2a first metallic layer
2b barrier layer
2c second metallic layer
4a first layer
4b second layer
4c third layer
5a first intermetallic layer
5b second intermetallic layer
5c third intermetallic layer
100 electronic component

DETAILED DESCRIPTION

Our method of attaching a semiconductor chip to a lead frame comprises, preferably in the specified order:
A) Providing a semiconductor chip
B) Applying a solder metal layer sequence on the semiconductor chip
C) Providing a lead frame
D) Applying a metallization layer sequence on the lead frame
E) Applying the semiconductor chip via the solder metal layer sequence and the metallization layer sequence on the lead frame. In particular, the application takes place such that after application, the metallization layer sequence and the solder metal layer sequence are located between the lead frame and the semiconductor chip.
F) Heating the arrangement produced under E) to attach the semiconductor chip to the lead frame. In particular, in step F), connection layer sequence is formed from the metallization layer sequence and the solder metal layer sequence.

That a layer or an element is arranged or applied "on" or "above" another layer or another element can mean that the one layer or the one element is arranged or applied directly in mechanical and/or electrical contact on the other layer or the other element. Furthermore, it can also mean that the one layer or the one element is arranged indirectly on or above the other layer or the other element. In this example, further layers and/or elements can then be arranged between the one or the other layer or between the one or the other element.

That a layer or an element is arranged "between" two other layers or elements can mean that the one layer or the one element is arranged directly in mechanical and/or electrical contact or in indirect contact with one of the other two layers or elements and in direct mechanical and/or electrical contact or in indirect contact with the other of the other two layers or elements. In the example of indirect contact, further layers and/or elements can then be arranged between the one and at least one of the other two layers or between the one and at least one of the other two elements.

The solder metal layer sequence may comprise a first metallic layer, a barrier layer arranged above the first metallic layer, and a second metallic layer arranged between the barrier layer and the semiconductor chip. The solder metal layer sequence can also consist of the first metallic layer, the barrier layer and the second metallic layer.

The solder metal layer sequence may comprise a first metallic layer comprising indium or an indium-tin alloy, a barrier layer arranged above the first metallic layer, and a second metallic layer comprising gold arranged between the barrier layer and the semiconductor chip. Preferably, after step E), the first metallic layer is arranged above the metallization layer sequence, the barrier layer is arranged above the first metallic layer and the second metallic layer is arranged above the barrier layer. Preferably, the first metallic layer consists of indium or the indium-tin alloy. Preferably, the second metallic layer consists of gold.

The indium-tin alloy of the first metallic layer may have the formula with $0<x<1$, preferably $0.5 \le x<1$.

The barrier layer is formed to first separate the metals of the first metallic layer, i.e. indium or indium and tin of the indium-tin alloy $In_xSn_{1-x}$, from the gold of the second metallic layer since both indium and the indium-tin alloy already produce a high melting point phase at room temperature with gold. Therefore, the first and the second metallic layers must first be separated from one another. Even after the melting temperature has been reached, the liquid indium or the liquid indium-tin alloy must be separated from one another in step F). This is done through the barrier layer. The barrier layer can also be described as a temporary diffusion barrier. The barrier layer is preferably arranged over the entire surface between the first metallic layer and the second metallic layer. In particular, the first metallic layer and the second metallic layer have no common interface.

The barrier layer may include nickel, titanium or platinum. Nickel, titanium or platinum can be the metals or compounds of these metals. The titanium compound can be $Ti_yW_{y-1}$ or $Ti_zN_{z-1}$. The barrier layer preferably comprises or consists of the metals nickel, titanium or platinum, particularly preferably nickel. These metals or compounds are particularly advantageous because they react only slowly and with a time delay with the liquid indium or the liquid indium-tin alloy after melting the indium or the indium-tin alloy in step F), thus ensuring a sufficient wetting of the metallization layer sequence with the liquid indium or the liquid indium-tin alloy.

The arrangement produced in step E) may be heated in step F) up to a temperature of 220° C., preferably 200° C., particularly preferably 190° C. Even at these temperatures, the indium or indium-tin alloy melts. Due to this comparatively low soldering temperature, hardly any thermally induced mechanical stresses occur when cooling the arrangement of lead frame and semiconductor chip. This prevents the semiconductor chip from detaching from the lead frame under mechanical load and there are no or hardly any cracks under mechanical load.

Using an indium-tin alloy $In_xSn_{1-x}$ reduces the melting temperature compared to pure indium or pure tin. For example, the alloy $Sn_{0.48}In_{0.52}$ has a melting temperature of approximately 121° C. In particular, $Sn_{0.48}In_{0.52}$ forms the eutectic. This makes it possible to keep the heating temperature lower than in known soldering methods. This leads to a reduction in stress due to the difference in thermal expansion behavior between the material of the semiconductor chip and the material of the lead frame.

When heating in step F), the indium or indium-tin alloy begins to melt. The surface of the metallization layer sequence is wetted with the liquid indium or the liquid indium-tin alloy and reacts with the material of the metallization layer sequence. At the same time, the indium or the indium-tin alloy reacts with the material of the barrier layer, in particular nickel, titanium or platinum. The existing barrier layer initially delays the reaction of the indium or the indium-tin alloy with the gold of the second metallic layer. This ensures that the metallization layer sequence is sufficiently wetted by the liquid indium or the indium-tin alloy. This would not be guaranteed if the indium or the indium-tin alloy reacts immediately with the gold of the second metallic layer since this reaction would produce a high melting point phase and the indium or the indium-tin alloy would not be sufficiently liquid for long enough to ensure a sufficient wetting of the metallization layer sequence and a reaction with the material of the metallization layer sequence.

A second intermetallic layer comprising or consisting of indium and the material of the barrier layer or indium, tin and the material of the barrier layer may be formed in step F) from the reaction of the indium or the indium-tin alloy with the material of the barrier layer, in particular nickel, titanium or platinum. At the same time, a first intermetallic layer is formed from the reaction of the indium or indium-tin alloy with the material of the metallization layer sequence. In particular, the first metallic layer is arranged between the first and the second intermetallic layer. The remaining liquid indium or the liquid indium-tin alloy diffuses through the second formed intermetallic layer into the second metallic layer and reacts with the gold to form a high-melting solid phase, which is referred to the third intermetallic layer. The third intermetallic layer comprises or consists of indium and gold or indium, tin and gold.

A connection layer sequence may be formed between the lead frame and the semiconductor chip in step F). The semiconductor chip may be attached to the lead frame via the connection layer sequence. The connection layer sequence may comprise a first intermetallic layer, a second intermetallic layer and a third intermetallic layer.

The first intermetallic layer may be arranged above the lead frame, the second intermetallic layer may be arranged above the first intermetallic layer and the third intermetallic layer may be arranged above the second intermetallic layer.

The metallization layer sequence may comprise a first layer comprising or consisting of nickel arranged above the lead frame. The metallization layer sequence can also consist of the first layer. The first intermetallic layer formed in step F) can comprise or consist of indium and nickel, or indium, tin and nickel, according to this example. The first and the second metallic layers can therefore include or consist of indium and nickel or indium, nickel and tin.

The metallization layer sequence may comprise a first layer comprising nickel arranged above the lead frame and a second layer comprising palladium arranged above the first layer. The second layer can also consist of palladium.

The metallization layer sequence may comprise a third layer comprising gold arranged above the first or second layer. The third layer can also consist gold.

The metallization layer sequence may consist of the first layer and the second third layer or the first layer, the second layer and the third layer.

In step E), the semiconductor chip may be applied on the lead frame such that the first metallic layer of the solder metal layer sequence is applied on the third layer of the metallization layer sequence. The first intermetallic layer formed in step F) can comprise or consist of indium, gold, palladium and nickel, or indium, tin, gold, palladium and nickel.

The barrier layer may have a thickness of 5 nm to 200 nm. With these layer thicknesses, a sufficient delay of the reaction of the indium or the indium-tin alloy with the gold of the second metallic layer can be ensured to wet the metallization layer sequence sufficiently with the liquid indium or the liquid indium-tin alloy.

The first metallic layer may have a thickness of 750 nm to 3 µm.

In particular, the layer thicknesses of the individual layers of the solder metal layer sequence and the metallization layer sequence may be matched to one another such that, in step F), the indium or the indium-tin alloy reacts off as completely as possible and it is ensured that the liquid indium or the liquid indium-tin alloy reacts with the gold of the second metallic layer of the solder metal layer sequence and the nickel of the first layer of the metallization layer sequence. Thus, after step F), the first intermetallic layer, the second intermetallic layer and the third intermetallic layer are preferably located between the semiconductor chip and the lead frame.

The second metallic layer of the solder metal layer sequence may have a layer thickness of 500 nm to 2 µm.

The first layer of the metallization layer sequence may have a layer thickness of 2 µm to 4 µm, for example, 3 µm.

The second layer of the metallization layer sequence may have a layer thickness of 10 nm to 20 nm.

The third layer of the metallization layer sequence may have a layer thickness of 3 nm to 5 nm. The third layer should not exceed a layer thickness of 5 nm to ensure that the high melting point phase formed from indium or the indium-tin alloy with gold does not become too thick and thus it can still be guaranteed that the liquid indium or the liquid indium-tin alloy penetrates to and reacts with the nickel of the first layer of the metallization layer sequence.

The lead frame can comprise copper.

The semiconductor chip may be a layer sequence with an active layer formed to emit electromagnetic radiation.

In this context, "layer sequence" means a layer sequence comprising more than one layer, for example, a sequence of a p-doped and an n-doped semiconductor layer, wherein the layers are arranged one above the other, and at least one active layer emitting electromagnetic radiation is included.

The layer sequence can be an epitaxial layer sequence or a radiation-emitting semiconductor chip with an epitaxial layer sequence, i.e. an epitaxially grown semiconductor layer sequence. The layer sequence can be formed on the basis of InGaAlN, for example. InGaAlN-based semiconductor chips and semiconductor layer sequences are in particular those in which the epitaxially produced semiconductor layer sequence has a layer sequence of different individual layers including at least one individual layer having a material from the III-V compound semiconductor material system $In_xAl_yGa_{1-x-y}N$ with $0 \leq x \leq 1$, $0 \leq y \leq 1$ and $x+y \leq 1$. Semiconductor layer sequences having at least one active layer based on InGaAlN can emit electromagnetic radiation in an ultraviolet to blue wavelength range, for example.

In addition to the active layer, the active semiconductor layer sequence can include other functional layers and functional areas such as p- or n-doped charge carrier transport layers, i.e. electron or hole transport layers, undoped or p- or n-doped confinement, cladding or waveguide layers, barrier layers, planarization layers, buffer layers, protective layers and/or electrodes as well as combinations thereof. Furthermore, one or more mirror layers can be deposited on a side of the semiconductor layer sequence facing away from the growth substrate. The structures described here, concerning the active layer or the other functional layers and regions, are known in particular with regard to construction, function and structure and are therefore not explained in detail here.

We also provide an electronic component. The electronic component is preferably produced by one of the methods specified in connection with one or more of the abovementioned examples. All features for the method are therefore also disclosed for the component and vice versa.

The component may be an optoelectronic component that generates radiation or light.

The electronic component comprises a lead frame and a semiconductor chip arranged above the lead frame. A connection layer sequence is arranged between the semiconductor chip and the lead frame. In particular, the semiconductor chip is attached to the lead frame via the connection layer sequence.

The connection layer sequence may comprise a first intermetallic layer, a second intermetallic layer and a third intermetallic layer. In particular, the first intermetallic layer is arranged above the lead frame, the second intermetallic layer is arranged above the first intermetallic layer and the third intermetallic layer is arranged above the second intermetallic layer. The connection layer sequence can also consist of the first, second and third intermetallic layers.

A first layer comprising or consisting of nickel may be arranged between the lead frame and the connecting layer sequence, in particular between the lead frame and the first intermetallic layer.

The first intermetallic layer of the connection layer sequence may comprise or consist of indium and nickel; indium, nickel and palladium; indium, nickel palladium and gold, indium, nickel and gold; tin, indium and nickel; tin, indium, nickel and palladium; tin, indium, nickel, palladium and gold or tin, indium, nickel and gold.

The second intermetallic layer may comprise indium and a titanium compound; indium and nickel; indium and platinum; indium and titanium; tin, indium and a titanium compound; tin, indium and nickel; Tin, indium and platinum or tin, indium and titanium or consists of indium and a titanium compound; indium and nickel; indium and platinum; indium and titanium; tin, indium and a titanium compound; tin, indium and nickel; tin, indium and platinum or tin, indium and titanium.

The third intermetallic layer of the connection layer sequence may comprise or consist of indium and gold or indium, tin and gold.

An adhesive layer may be arranged between the semiconductor chip and the connection layer sequence. The adhesive layer can be one or more metallic layers. For example, the metal can be selected from a group comprising platinum, titanium and gold.

The semiconductor chip may be arranged on a substrate. The substrate can, for example, be a sapphire substrate.

Further advantages and developments result from the examples described in the following in connection with the Figures. Same and similar or similar acting elements are provided with the same reference signs. The Figures and the proportions of the elements shown in the Figures are not to be regarded as true to scale. Rather, individual elements can be shown exaggeratedly large or simplified for better representability and/or better comprehensibility.

FIG. 1A shows a semiconductor chip 1 above which a solder metal layer sequence 2 is arranged. The solder metal layer sequence comprises a first metallic layer 2a, a barrier layer 2b arranged above the first metallic layer 2a and a second metallic layer 2c arranged above the barrier layer 2b. The first metallic layer 2a comprises or consists of indium or an indium-tin alloy of the formula $In_xSn_{1-x}$ with 0<x≤1. The barrier layer 2b consists of nickel, titanium or platinum and the second metallic layer 2c consists of gold. The first metallic layer 2a has a layer thickness of 750 nm to 3 µm, the barrier layer has a layer thickness of 5 nm to 200 nm and the second metallic layer 2c has a layer thickness of 500 nm to 2 µm. FIG. 1A also shows a lead frame 3, above which a metallization layer sequence 4 is arranged. The metallization layer sequence 4 consists of a first layer 4a comprising or consisting of nickel arranged above the lead frame 3, a second layer 4b comprising or consisting of palladium arranged above the first layer 4a and a third layer 4c comprising or consisting of gold arranged above the second layer 4b. The first layer 4a, for example, has a layer thickness of 3 µm. The second layer 4b has a layer thickness of 10 nm to 20 nm and the third layer 4c has a layer thickness of 3 nm to 5 nm.

Figure 1B:
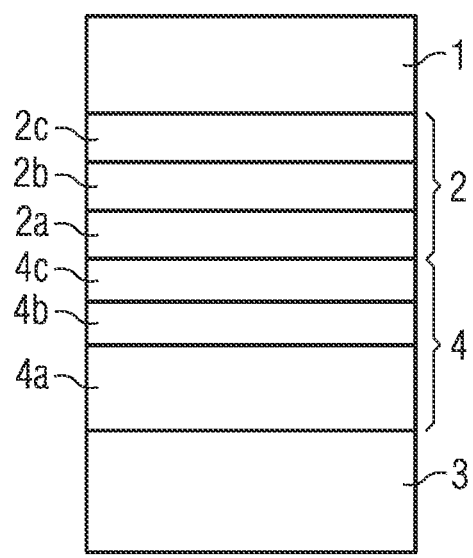

FIG. 1B shows an arrangement in which the semiconductor chip 1 is arranged on the lead frame 3 via the solder metal layer sequence 2 and the metallization layer sequence 4.

By heating the arrangement shown in FIG. 1B to a temperature of about 200° C., the indium or the indium-tin alloy melts in the first metallic layer 2a. The liquid indium or the liquid indium-tin alloy wets the third layer 4c of the metallization layer sequence 4. The liquid indium or the liquid indium-tin alloy reacts with the nickel, platinum or titanium of the barrier layer 2b and forms, as shown in FIG. 1C, a second intermetallic layer 5b. At the same time the liquid indium or the liquid indium-tin alloy reacts with the gold of the third layer 4c, the palladium of the second layer 4b and the nickel of the first layer 4a and forms a first intermetallic layer 5a. As shown, the nickel of the first layer 4a cannot completely react with the liquid indium or the liquid indium-tin alloy so that a reduced thickness of the first layer 4a remains. However, it is also possible that the nickel reacts completely with the liquid indium or the liquid indium-tin alloy and thus no layer 4a is present anymore.

The liquid indium remaining in the first metallic layer 4a or the liquid indium-tin alloy remaining in the first metallic layer 4a diffuses by grain boundary diffusion through the second intermetallic layer 5b to the second metallic layer 2c and reacts there with the gold to form a third intermetallic layer 5c as shown in FIG. 1D. The electronic component 100 shown in FIG. 1D, in particular an optoelectronic component 100, comprises a lead frame 3, a first layer 4a arranged above the lead frame 3, comprising or consisting of nickel. A connecting layer sequence 5 is arranged above the first layer. The connection layer sequence 5 comprises a first intermetallic layer 5a, a second intermetallic layer 5b arranged above the first intermetallic layer 5a, and a third intermetallic layer 5c arranged above the second intermetallic layer 5b. The semiconductor chip 1 is attached to the lead frame 3 via the connection layer sequence 5.

Figure 2:
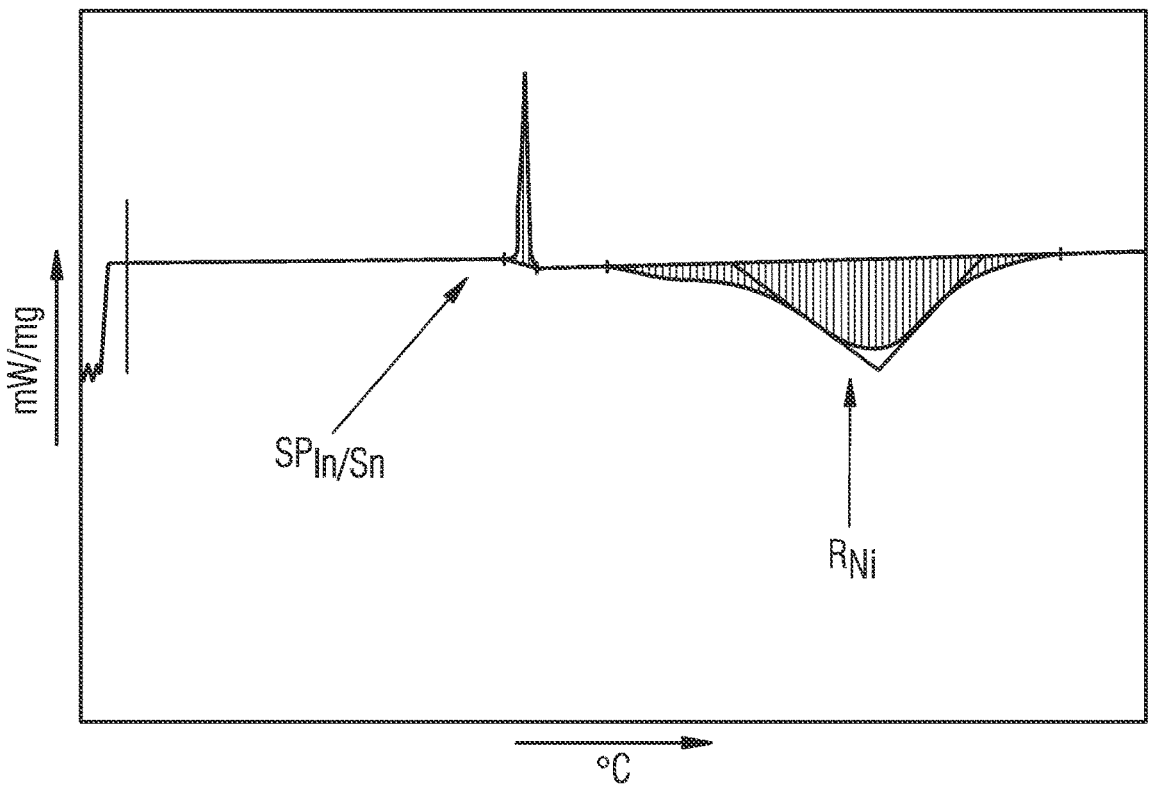
FIGS. 2 and 3 show dynamic differential calometry diagrams.
Figure 3:
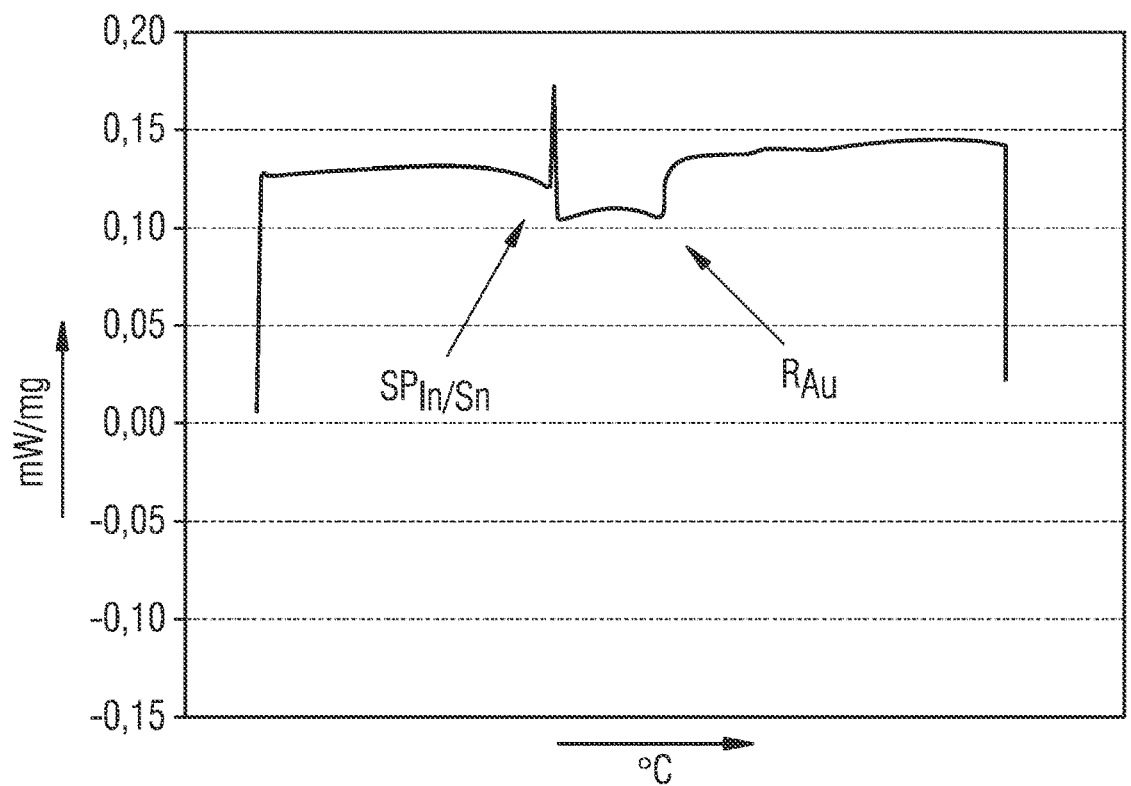

FIGS. 2 and 3 show dynamic differential calorimetry diagrams. The temperature in ° C. is indicated on the x-axis and mW/mg on the y-axis.

FIG. 2 shows the dynamic differential calorimetry diagram of the reaction of an indium-tin alloy $In_xSn_{1-x}$ with 0<x≤1 with nickel. $SP_{In/Sn}$ is the melting point of the indium-tin alloy and $R_{Ni}$ is the reaction of the liquid indium-tin alloy with nickel. The reaction with the nickel takes place very slowly and does not occur immediately after reaching the melting temperature. For this reason, nickel is particularly suitable for its use in the barrier layer since this ensures that the metallization layer sequence is sufficiently wetted with the liquid indium-tin alloy.

FIG. 3 shows the dynamic differential calorimetry diagram of the reaction of an indium-tin alloy $In_xSn_{1-x}$ with 0<x≤1 with gold. $SP_{In/Sn}$ is the melting point of the indium-tin alloy and $R_{Au}$ is the reaction of the liquid indium-tin alloy with gold. The reaction of the gold occurs immediately after the indium-tin alloy has melted and the existing barrier is broken. Thus, when using a too thin or no barrier layer, the metallization layer sequence cannot be wetted or not sufficiently wetted because the indium tin alloy solidifies with the gold of the second metallic layer to form a high melting point phase before wetting and reaction with the metals of the metallization layer sequence takes place.

Our methods and components are not limited by the description based on the examples. Rather, this disclosure includes each new feature as well as each combination of features, which in particular includes each combination of features in the appended claims, even if the feature or combination itself is not explicitly mentioned in the claims and examples.

The priority of DE 102017104276.8 is claimed, the subject matter of which is expressly incorporated herein by reference.

The invention claimed is:

1. A method of attaching a semiconductor chip to a lead frame, comprising:
   A) providing a semiconductor chip,
   B) applying a solder metal layer sequence on the semiconductor chip,
   C) providing a lead frame,
   D) applying a metallization layer sequence on the lead frame,
   E) applying the semiconductor chip on the lead frame via the solder metal layer sequence and the metallization layer sequence, and
   F) heating the arrangement produced under E) to attach the semiconductor chip to the lead frame, wherein the solder metal layer sequence comprises:
      a first metallic layer comprising an indium-tin alloy, having a formula $In_xSn_{1-x}$, wherein 0.5≤x<1,
      a barrier layer arranged above the first metallic layer, and
      a second metallic layer comprising gold arranged between the barrier layer and the semiconductor chip.

2. The method according to claim 1, wherein the metallization layer sequence comprises a first layer comprising nickel arranged above the lead frame.

3. The method according to claim 1, wherein the barrier layer includes nickel, titanium, platinum or a titanium compound.

4. The method according to claim 1, wherein, in step F), a connection layer sequence is formed between the lead frame and the semiconductor chip, and the connection layer sequence comprises:
   a first intermetallic layer comprising indium and nickel or indium, tin and nickel,
   a second intermetallic layer comprising indium and nickel; indium and titanium; indium and a titanium compound; indium and platinum; indium, tin and nickel; indium, tin and titanium; indium, tin and a titanium compound or indium, tin and platinum, and a third intermetallic layer comprising indium and gold or indium, tin and gold.

5. The method according to claim 1, wherein the metallization layer sequence comprises:
- a first layer comprising nickel arranged above the lead frame,
- a second layer comprising palladium arranged above the first layer, and
- a third layer comprising gold arranged above the second layer.

6. The method according to claim 5, wherein, in step E), the semiconductor chip is applied on the lead frame such that the first metallic layer of the solder metal layer sequence is applied on the third layer of the metallization layer sequence.

7. The method according to claim 1, wherein the barrier layer has a layer thickness of 5 nm to 200 nm.

8. The method according to claim 1, wherein the first metallic layer has a layer thickness of 750 nm to 3 μm.

9. The method according to claim 1, wherein the second metallic layer has a layer thickness of 500 nm to 2 μm.

10. The method according to claim 5, wherein the third layer has a layer thickness of 3 nm to 5 nm.

* * * * *